US 6,734,534 B1

(12) United States Patent
Vu et al.

(10) Patent No.: US 6,734,534 B1
(45) Date of Patent: May 11, 2004

(54) MICROELECTRONIC SUBSTRATE WITH INTEGRATED DEVICES

(75) Inventors: Quat T. Vu, Santa Clara, CA (US); Jian Li, Sunnyvale, CA (US); Steven Towle, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/692,908

(22) Filed: Oct. 19, 2000

Related U.S. Application Data

(63) Continuation-in-part of application No. 09/640,961, filed on Aug. 16, 2000, now abandoned.

(51) Int. Cl.⁷ .............................. H05K 3/34; H05K 7/02; H01L 23/34; H01L 23/28; H01L 23/02
(52) U.S. Cl. .................. 257/668; 257/723; 257/685; 257/701; 257/758; 257/774; 257/680; 257/673; 257/782
(58) Field of Search ................... 257/782, 774, 257/680, 700, 701, 702, 703, 723, 685, 686, 690–693, 696, 698, 684, 796; 174/52.1, 52.2, 52.3, 52.4

(56) References Cited

U.S. PATENT DOCUMENTS

| 5,048,179 A | * | 9/1991 | Shindo et al. ............... 29/840 |
| 5,324,687 A | * | 6/1994 | Wojnarowski |
| 5,353,195 A | * | 10/1994 | Fillion et al. ............... 257/700 |
| 5,353,498 A | * | 10/1994 | Fillion et al. ............... 29/840 |
| 5,422,513 A | | 6/1995 | Marcinkiewicz et al. |
| 5,497,033 A | | 3/1996 | Fillion et al. |
| 5,527,741 A | | 6/1996 | Cole et al. |
| 5,696,666 A | * | 12/1997 | Miles et al. ............... 257/684 |
| 5,703,400 A | | 12/1997 | Wojnarowski et al. |
| 5,745,984 A | | 5/1998 | Cole, Jr. et al. |
| 5,841,193 A | * | 11/1998 | Eichelberger ............... 257/723 |
| 5,998,859 A | | 12/1999 | Griswold et al. ............ 257/679 |
| 6,023,096 A | * | 2/2000 | Hotta et al. ............... 257/687 |
| 6,127,833 A | * | 10/2000 | Wu et al. ............... 324/755 |
| 6,180,881 B1 | * | 1/2001 | Isaak ............... 257/686 |
| 6,221,694 B1 | | 4/2001 | Bhatt et al. ............... 438/122 |
| 6,239,482 B1 | | 5/2001 | Fillion et al. ............... 257/678 |
| 6,265,759 B1 | * | 7/2001 | DiStefano et al. .......... 257/666 |
| 6,271,469 B1 | * | 8/2001 | Ma et al. ............... 174/52.4 |
| 6,288,905 B1 | | 9/2001 | Chung ............... 361/771 |
| 6,306,680 B1 | * | 10/2001 | Fillion et al. ............... 438/106 |
| 6,389,689 B2 | * | 5/2002 | Heo ............... 257/778 |
| 6,489,185 B1 | * | 12/2002 | Towle et al. ............... 438/127 |
| 2002/0105073 A1 | * | 8/2002 | Smith ............... 257/730 |
| 2003/0013232 A1 | * | 1/2003 | Towle et al. ............... 438/113 |

FOREIGN PATENT DOCUMENTS

| JP | 11045955 | 2/1999 |
| JP | 11312868 | 11/1999 |

\* cited by examiner

*Primary Examiner*—Alexander O. Williams
(74) *Attorney, Agent, or Firm*—Schwegman, Lundberg, Woessner & Kluth, P.A.

(57) ABSTRACT

A microelectronic substrate including at least one microelectronic die disposed within an opening in a microelectronic substrate core, wherein an encapsulation material is disposed within portions of the opening not occupied by the microelectronic dice, or a plurality microelectronic dice encapsulated without the microelectronic substrate core. Interconnection layers of dielectric materials and conductive traces are then fabricated on the microelectronic die, the encapsulation material, and the microelectronic substrate core (if present) to form the microelectronic substrate.

4 Claims, 9 Drawing Sheets

US 6,734,534 B1

MICROELECTRONIC SUBSTRATE WITH INTEGRATED DEVICES

Related Applications: This is a continuation-in-part of application Ser. No. 09/640961, filed Aug. 16, 2000.

BACKGROUND OF THE INVENTION

1. Field of the Invention

The present invention relates to apparatus and processes for the fabrication of a microelectronic substrate. In particular, the present invention relates to a fabrication technology that encapsulates at least one microelectronic die within a microelectronic substrate core or that encapsulates at least one microelectronic die (without a microelectronic substrate core) to form a microelectronic substrate.

2. State of the Art

Substrates which connect individual microelectronic devices exist in virtually all recently manufactured electronic equipment. These substrates are generally printed circuit boards. Printed circuit boards are basically dielectric substrates with metallic traces formed in or upon the dielectric substrate. One type of printed circuit board is a single-sided board. As shown in FIG. 20, single-sided board 200 consists of a dielectric substrate 202, such as an FR4 material, epoxy resins, polyimides, triazine resins, and the like, having conductive traces 204, such as copper, aluminum, and the like, on one side (i.e., first surface 206), wherein the conductive traces 204 electrically interconnect microelectronic devices 208 (shown as flip-chips) attached to the first surface 206. However, single-sided boards 200 result in relatively long conductive traces 204 which, in turn, results in slower speeds and performance. Single-sided boards 200 also require substantial surface area for the routing of the conductive traces 204 to interconnect the various microelectronic devices 208 which increases the size of the resulting assembly.

It is, of course, understood that the depiction of the dielectric substrate 202, the conductive traces 204, and the microelectronic devices 208 in FIG. 20 (and subsequently FIGS. 21 and 22) are merely for illustration purposes and certain dimensions are greatly exaggerated to show the concept, rather than accurate details thereof.

Double-sided boards 210 were developed to help alleviate the problem with relatively long conductive traces. As shown in FIG. 21, the double-sided board 210 comprises a dielectric substrate 202 having conductive traces 204 on the dielectric substrate first surface 206 and on a dielectric substrate second surface 212. At least one electrically conductive via 214 extends through the dielectric substrate 202 to connect at least one conductive trace 204 on the first surface 206 with at least one conductive trace 204 on the second surface 212. Thus, the microelectronic devices 208 on the dielectric substrate first surface 206 and on the dielectric substrate second surface 212 may be in electrical communication. The electrically conductive vias 214 are generally plated through-hole vias and may be formed in any manner known in the art.

FIG. 22 illustrates another board design, known as a multi-layer board 220. A multi-layer board 220 comprises two or more pieces of dielectric material (shown as first dielectric material 222 and second dielectric material 224) with conductive traces 204 thereon and therebetween with electrically conductive vias 214 formed through the first dielectric material 222 and the second dielectric material 224. This design allows for shorter traces and reduced surface area requirements for conductive trace 204 routing.

Although such boards have been adequate for past and current microelectronic device applications, the need for higher performance and shorter traces of substrate boards increases as the speed and performance of the microelectronic devices increases. Therefore, it would be advantageous to develop new substrates/boards, which achieve higher speed and performance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1–19 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

The present invention includes a substrate fabrication technology that places at least one microelectronic die within at least one opening in a microelectronic substrate core and secures the microelectronic die/dice within the opening(s) with an encapsulation material or that encapsulates at least one microelectronic die within an encapsulation material without a microelectronic substrate core. Interconnection layers of dielectric materials and conductive traces are then fabricated on the microelectronic die/dice, the encapsulation material, and the microelectronic substrate core (if present) to form a microelectronic substrate. The term "microelectronic substrate" is defined to include motherboards, peripheral cards, cartridges, multi-chip module substrates, and similar structures as will be evident to one skilled in the art.

The technical advantage of this invention is that it enables the microelectronic substrate to be built around the microelectronic die/dice, which results in a shorter interconnect distance between microelectronic dice within the microelectronic substrate and microelectronic devices attached thereto. This, in turn, results in higher speed and performance. Furthermore, the microelectronic substrate of the present invention may also result in a smaller form factor, which is well suited to mobile systems (i.e., laptop computers, handheld devices, personal digital assistants, etc.).

Figure 1:
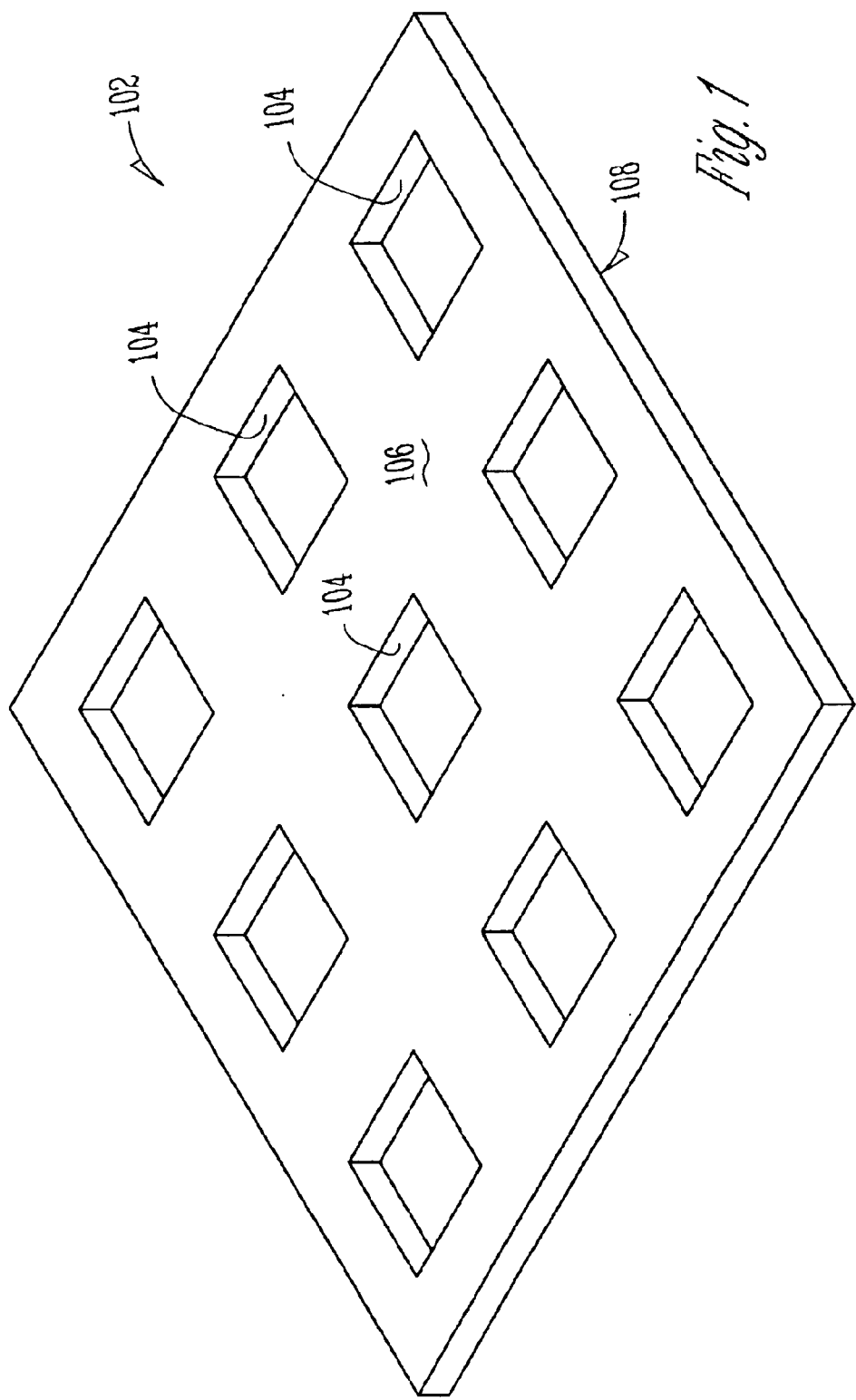
FIG. 1 is an oblique view of a microelectronic substrate core, according to the present invention.
Figure 2:
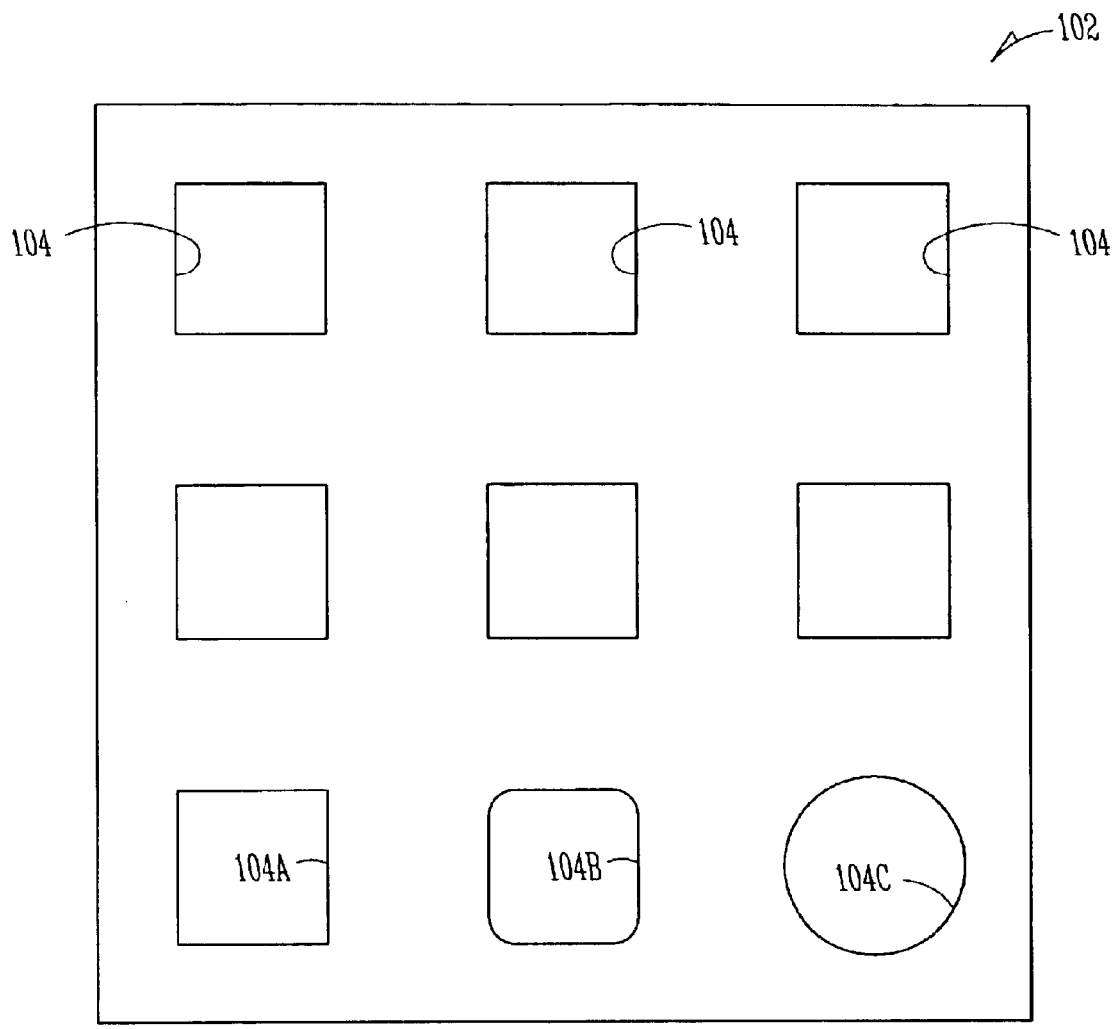
FIG. 2 is a top plan view of a microelectronic substrate core having examples of alternate microelectronic substrate core openings, according to the present invention.

FIG. 1 illustrates a microelectronic substrate core 102 used to fabricate a microelectronic substrate. The microelectronic substrate core 102 preferably comprises a substantially planar material. The material used to fabricate the microelectronic substrate core 102 may include, but is not limited to, a Bismaleimide Triazine ("BT") resin based laminate material, an FR4 laminate material (a flame retarding glass/epoxy material), various polyimide laminate materials, ceramic material, and the like, and metallic materials (such as copper) and the like. The microelectronic substrate core 102 has at least one opening 104 extending therethrough from a first surface 106 of the microelectronic substrate core 102 to an opposing second surface 108 of the microelectronic substrate core 102. As shown in FIG. 2, the opening(s) 104 may be of any shape and size including, but not limited to, rectangular/square 104a, rectangular/square with rounded corners 104b, and circular 104c. The only limitation on the size and shape of the opening(s) 104 is that they must be appropriately sized and shaped to house a corresponding microelectronic die or dice therein, as will be discussed below.

Figure 3:
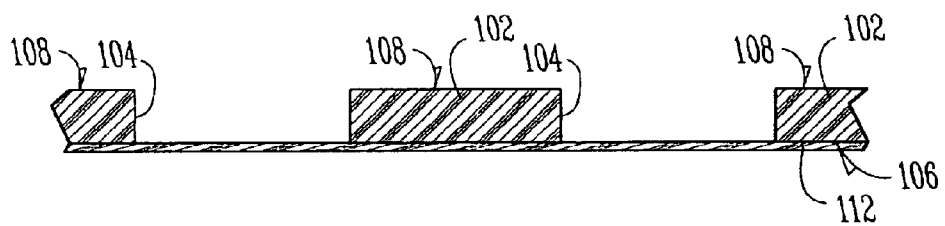
FIG. 3 is a side cross-sectional view of a microelectronic substrate core abutted to a protective film, according to the present invention.
Figure 4:
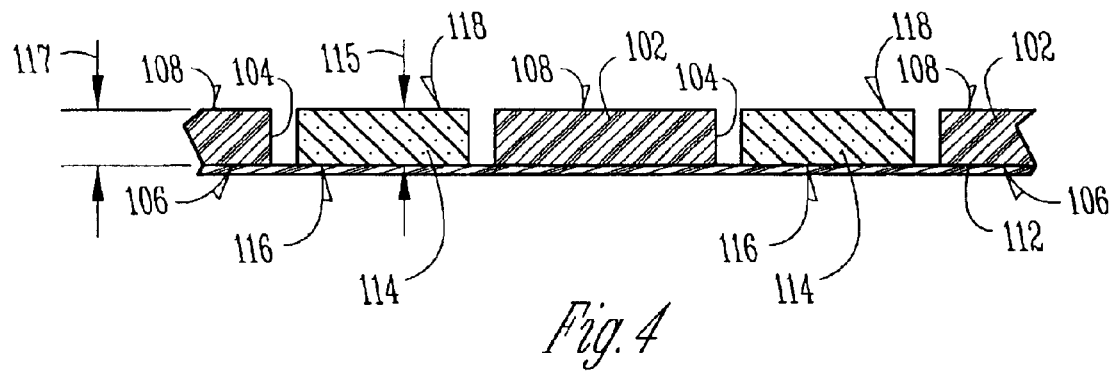
FIG. 4 is a side cross-sectional view of microelectronic dice disposed within openings of the microelectronic substrate core, which also abuts the protective film, according to the present invention.

FIG. 3 illustrates the microelectronic substrate core first surface 106 abutting a protective film 112. The protective film 112 is preferably a substantially flexible material, such as Kapton® polyimide film (E. I. du Pont de Nemours and Company, Wilmington, Del.), but may be made of any appropriate material, including metallic films. In a preferred embodiment, the protective film 112 would have substantially the same coefficient of thermal expansion (CTE) as the microelectronic substrate core. FIG. 4 illustrates microelectronic dice 114, each having an active surface 116 and a back surface 118, placed in corresponding openings 104 of the microelectronic substrate core 102. The microelectronic dice 114 may be any known active or passive microelectronic device including, but not limited to, logic (CPUs), memory (DRAM, SRAM, SDRAM, etc.), controllers (chip sets), capacitors, resistors, inductors, and the like.

In a preferred embodiment (illustrated), the thickness 117 of the microelectronic substrate core 102 and the thickness 115 of the microelectronic dice 114 are substantially equal. The microelectronic dice 114 are each placed such that their active surfaces 116 abut the protective film 112. The protective film 112 may have an adhesive, such as silicone or acrylic, which attaches to the microelectronic substrate core first surface 106 and the microelectronic die active surface 116. This adhesive-type film may be applied prior to placing the microelectronic die 114 and microelectronic substrate core 102 in a mold, liquid dispense encapsulation system (preferred), or other piece of equipment used for the encapsulation process. The protective film 112 may also be a non-adhesive film, such as a ETFE (ethylene-tetrafluoroethylene) or Teflon® film, which is held on the microelectronic die active surface 116 and the microelectronic substrate core first surface 106 by an inner surface of the mold or other piece of equipment during the encapsulation process.

Figure 5:
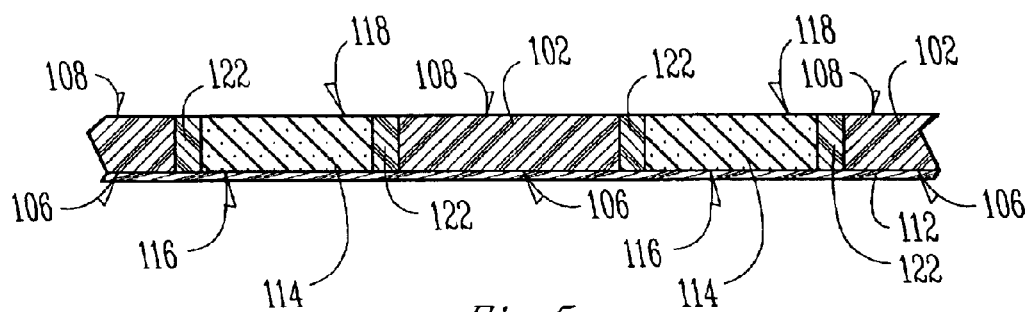
FIG. 5 is a side cross-sectional view of the assembly of FIG. 4 after encapsulation, according to the present invention.

The microelectronic die 114 is then encapsulated with an encapsulation material 122, such as plastics, resins, epoxies, elastomeric (e.g., rubbery) materials, and the like. As shown in FIG. 5, the encapsulation material 122 is disposed in portions of the opening(s) 104 not occupied by the microelectronic die 114. The encapsulation of the microelectronic die 114 may be achieved by any known process, including but not limited to transfer and compression molding, and dispensing. The encapsulation material 122 secures the microelectronic die 114 within the microelectronic substrate core 102 and provides mechanical rigidity for the resulting structure and provides surface area for the subsequent build-up of trace layers.

Figure 6:
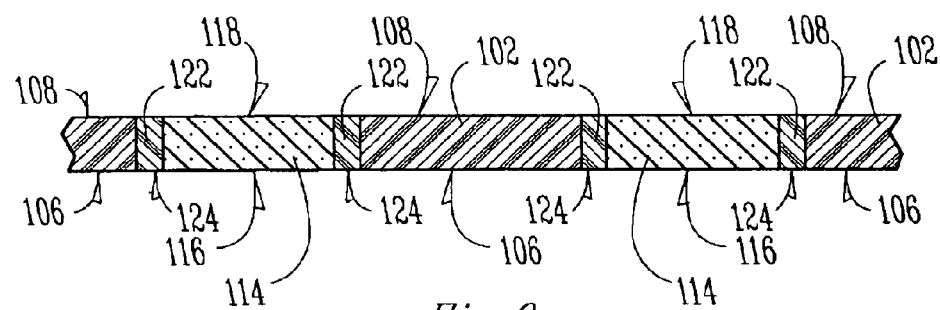
FIG. 6 is a side cross-sectional view of the assembly of FIG. 5 after the protective film has been removed, according to the present invention.

After encapsulation, the protective film 112 is removed, as shown in FIG. 6, to expose the microelectronic die active surface 116. As also shown in FIG. 6, the encapsulation material 122 is preferably molded or dispensed to fill the space between the microelectronic substrate core first surface 106 and the microelectronic die active surface 116. This results in at least one surface 124 that is substantially planar to the microelectronic die active surface 116 and the microelectronic substrate core first surface 106. The encapsulation material surface 124 may be utilized in further fabrication steps, along with the microelectronic substrate core first surface 106, as additional surface area for the formation of interconnection layers, such as dielectric material layers and conductive traces.

Although the following description relates to a bumpless, built-up layer technique for the formation of interconnection layers, the method of fabrication is not so limited. The interconnection layers may be fabricated by a variety of techniques known in the art.

Figure 7:
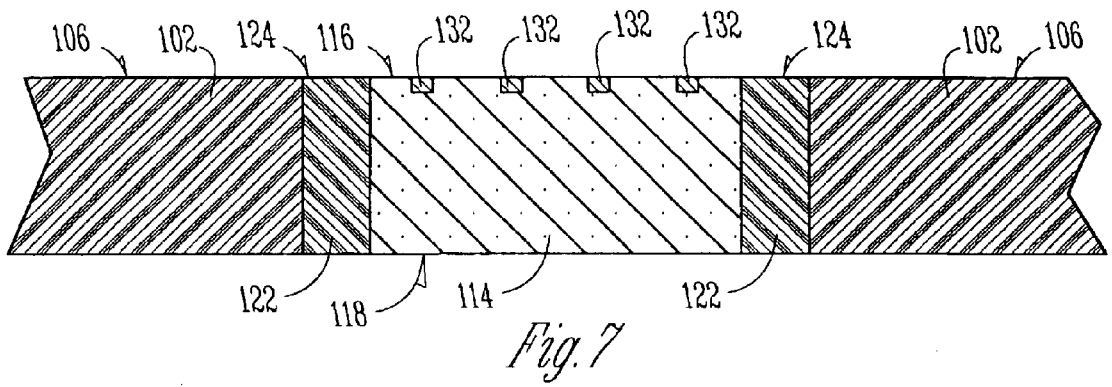
FIGS. 7–15 are side cross-sectional views of a process of forming interconnection layers on a microelectronic die, encapsulation material, and a microelectronic substrate core, according to the present invention.

FIG. 7 illustrates a view of a single microelectronic die 114 encapsulated with encapsulation material 122 within the microelectronic substrate core 102. The microelectronic die 114, of course, includes a plurality of electrical contacts 132 located on the microelectronic die active surface 116. The electrical contacts 132 are electrically connected to circuitry (not shown) within the microelectronic die 114. Only four electrical contacts 132 are shown for sake of simplicity and clarity.

Figure 8:
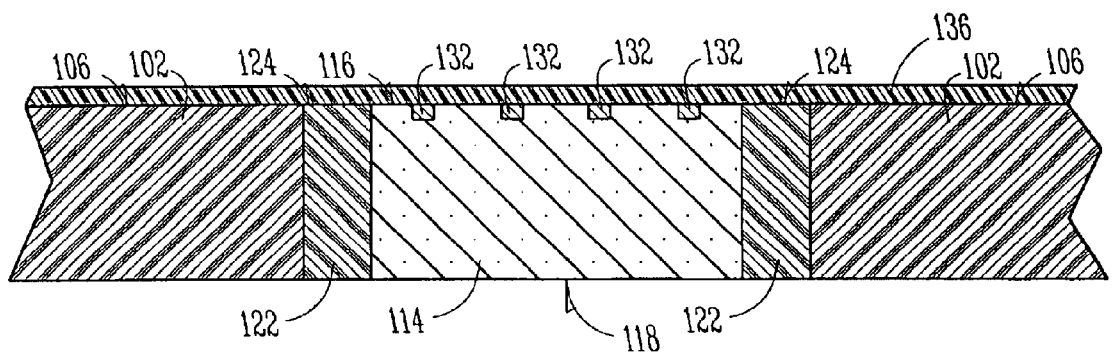

As shown in FIG. 8, a first dielectric layer 136, such as epoxy resin, polyimide, bisbenzocyclobutene, and the like, is disposed over the microelectronic die active surface 116 (including the electrical contacts 132), the microelectronic substrate core first surface 106, and the encapsulation material surface 124. The dielectric layers of the present invention are preferably filled epoxy resins available from Ibiden U.S.A. Corp., Santa Clara, Calif., U.S.A. and from Ajinomoto U.S.A., Inc., Paramus, N.J., U.S.A. The formation of the first dielectric layer 136 may be achieved by any known process, including but not limited to lamination, spin coating, roll coating, and spray-on deposition.

Figure 9:
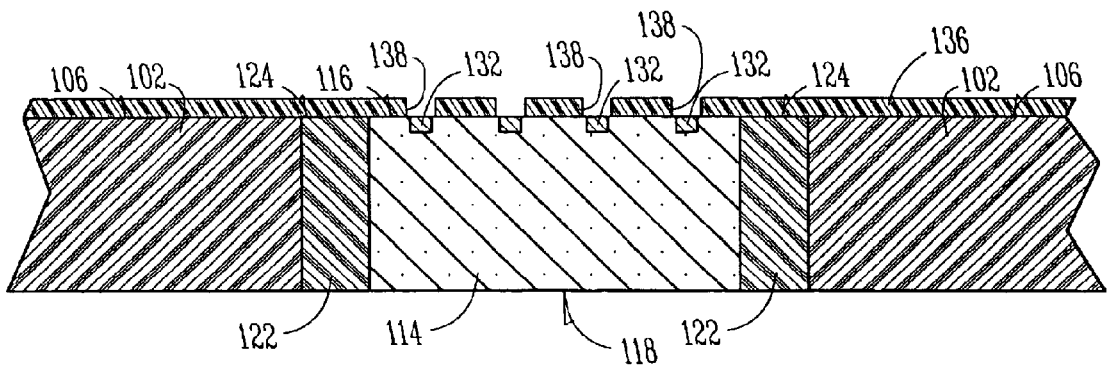

As shown in FIG. 9, a plurality of vias 138 are then formed through the first dielectric layer 136. The plurality of vias 138 may be formed by any method known in the art, including but not limited to laser drilling, photolithography (usually followed by an etch), and, if the first dielectric layer 136 is photoactive, forming the plurality of vias 138 in the same manner that a photoresist mask is made in a photolithographic process, as known in the art.

Figure 10:
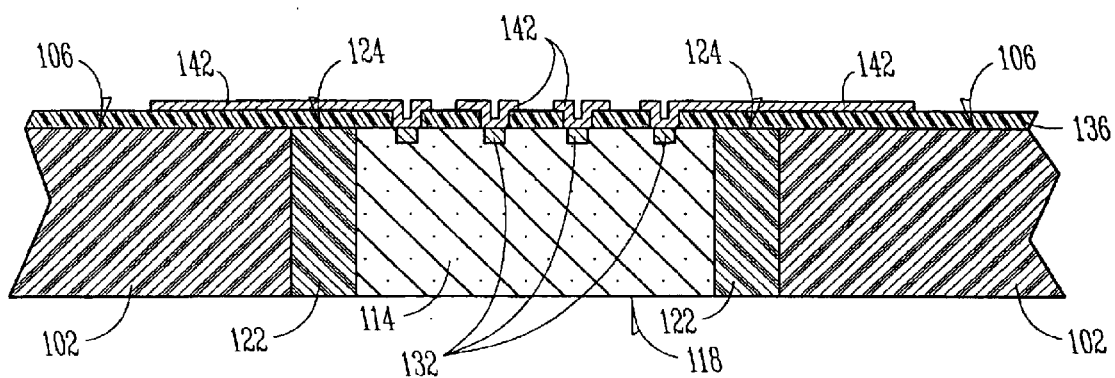

A plurality of conductive traces 142 is formed on the first dielectric layer 136, as shown in FIG. 10, wherein a portion of each of the plurality of conductive traces 142 extends into at least one of said plurality of vias 138 (see FIG. 9) to make electrical contact with the contacts 132. The plurality of conductive traces 142 may be made of any applicable conductive material, such as copper, aluminum, and alloys thereof.

The plurality of conductive traces 142 may be formed by any known technique, including but not limited to semi-additive plating and photolithographic techniques. An exemplary semi-additive plating technique can involve depositing a seed layer, such as a sputter-deposited or electroless-deposited metal on the first dielectric layer 136. A resist layer is then patterned on the seed layer, such as a titanium/copper alloy, followed by electrolytic plating of a layer of metal, such a copper, on the seed layer exposed by open areas in the patterned resist layer. The patterned resist layer is stripped and portions of the seed layer not having the layer of metal plated thereon is etched away. Other methods of forming the plurality of conductive traces 142 will be apparent to those skilled in the art.

Figure 11:
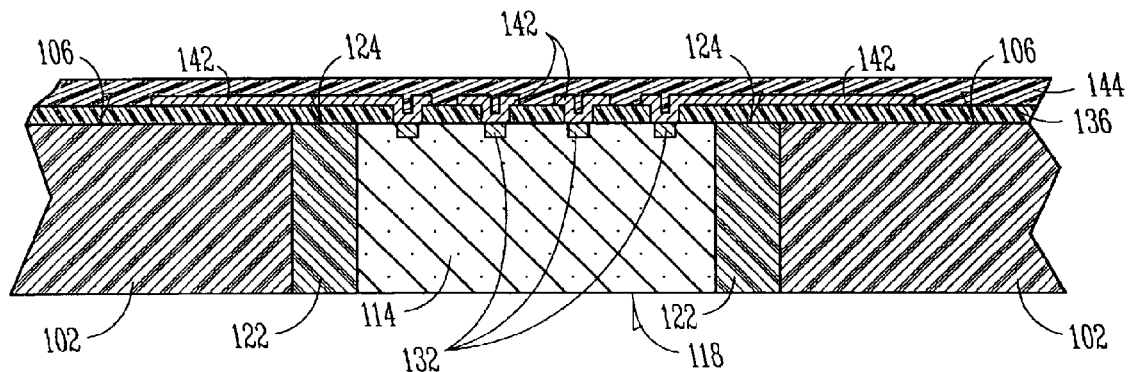

As shown in FIG. 11, a second dielectric layer 144 is disposed over the plurality of conductive traces 142 and the first dielectric layer 136. The formation of the second dielectric layer 144 may be achieved by any known process, including but not limited to film lamination, spin coating, roll coating, and spray-on deposition.

Figure 12:
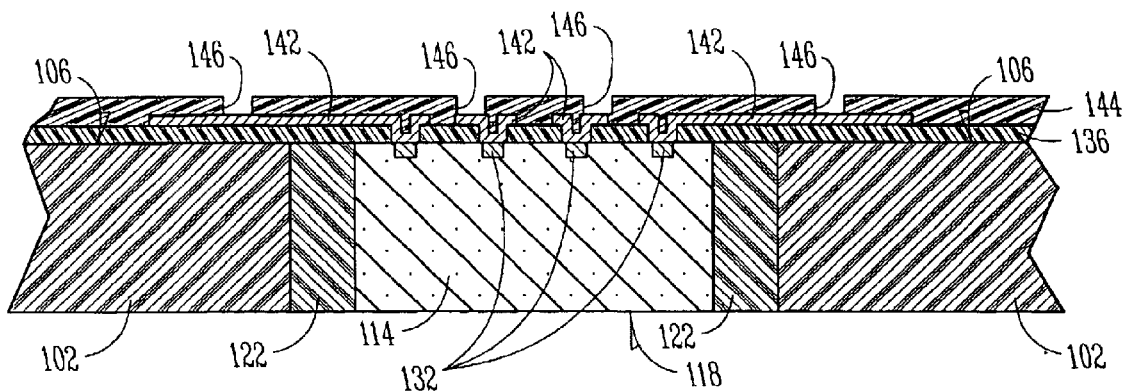

As shown in FIG. 12, a plurality of second vias 146 is then formed through the second dielectric layer 144. The plurality of second vias 146 may be formed any method known in the art, including but not limited to laser drilling and, if the second dielectric layer 144 is photoactive, forming the plurality of second vias 146 in the same manner that a photoresist mask is made in a photolithographic process, as known in the art.

If the plurality of conductive traces 142 is not capable of placing the plurality of second vias 146 in an appropriate position, then other portions of the conductive traces are formed in the plurality of second vias 146 and on the second dielectric layer 144, another dielectric layer formed thereon, and another plurality of vias is formed in the dielectric layer, such as described in FIGS. 10–12. The layering of dielectric layers and the formation of conductive traces can be repeated until the vias are in an appropriate position, and sufficient electrical connectivity is established to enable the required electrical performance. Thus, portions of a single conductive trace be formed from multiple portions thereof and can reside on different dielectric layers.

Figure 13:
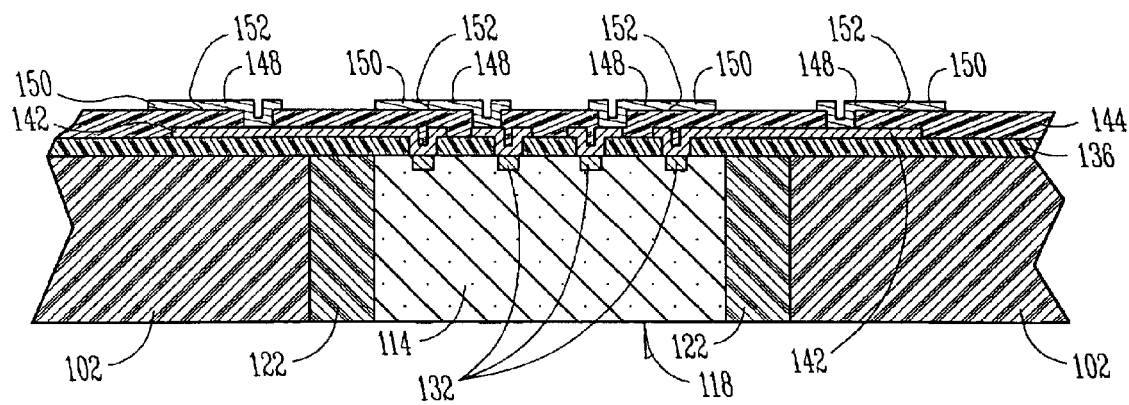

A second plurality of conductive traces 148 may be formed, wherein a portion of each of the second plurality of conductive traces 148 extends into at least one of said plurality of second vias 146. The second plurality of conductive traces 148 each includes a landing pad 150 (an enlarged area on the traces demarcated by a dashed line 152), as shown in FIG. 13.

Figure 14:
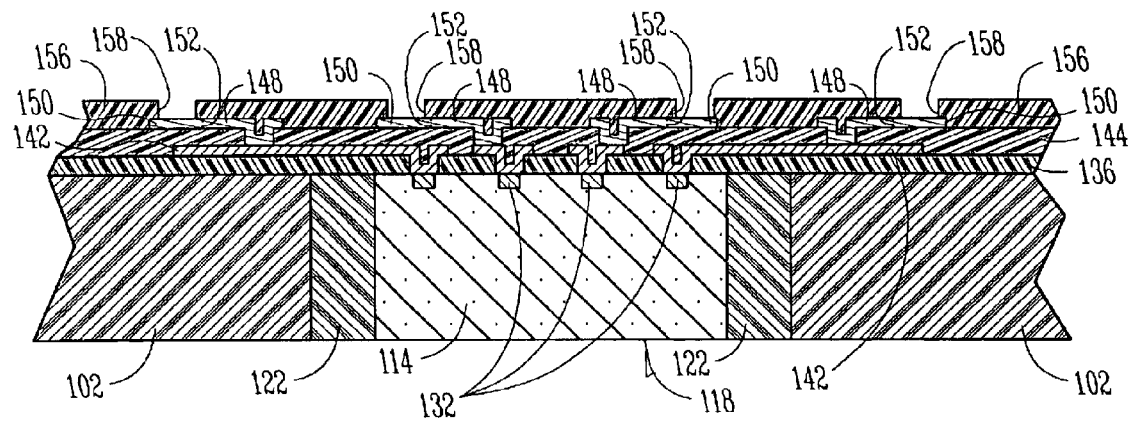
Figure 15:
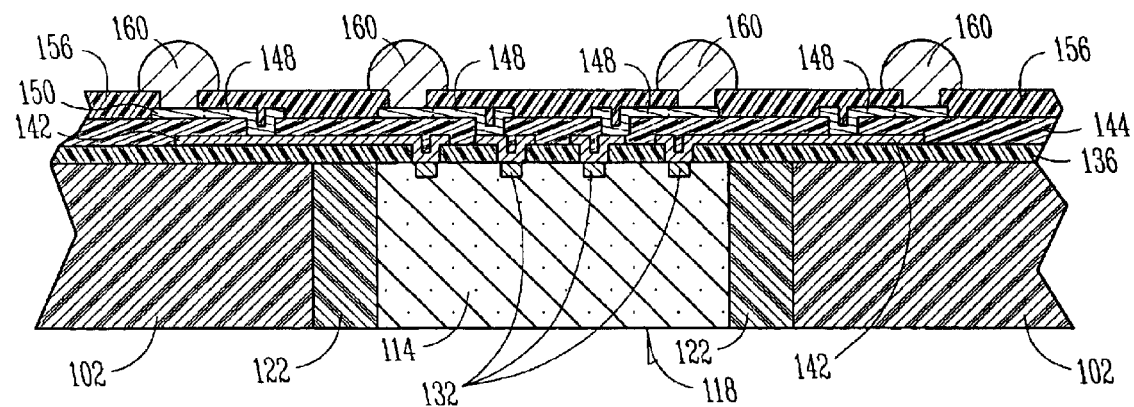

Once the second plurality of conductive traces 148 and landing pads 150 are formed, they can be used in the formation of conductive interconnects, such as solder bumps, solder balls, pins, and the like, for communication with external components (not shown). For example, a solder mask material 156 can be disposed over the second dielectric layer 144 and the second plurality of conductive traces 154 and landing pads 150. A plurality of vias 158 is then formed in the solder mask material 156 to expose at least a portion of each of the landing pads 150, as shown in FIG. 14. A plurality of conductive bumps 160, such as solder bumps, can be formed, if desired, such as by, but not limited to, screen printing solder paste followed by a reflow process or by known plating techniques, on the exposed portion of each of the landing pads 154, as shown in FIG. 15.

Figure 16:
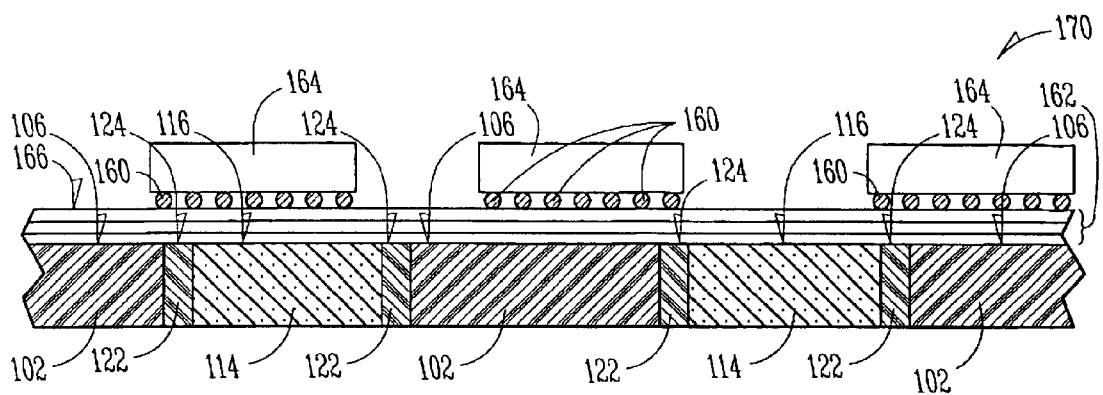
FIG. 16 is a side cross-sectional view of the assembly of FIG. 6 having interconnection layers and solder balls positioned thereon, according to the present invention.

FIG. 16 illustrates a plurality of microelectronic dice 114 encapsulated with encapsulation material 122 within the microelectronic substrate core 102 to form the microelectronic substrate 170 of the present invention. At least one interconnection layer is formed on the microelectronic dice active surfaces 116, the microelectronic substrate core first surface 106, and the encapsulation material surface 124 in the manner previously discussed. The layer(s) of dielectric material and conductive traces comprising the interconnection layer is simply designated together as interconnection layer 162 in FIG. 16. This interconnection layer 162 serves not only to form connections between the microelectronic dice 114 and the plurality of conductive bumps 160, as described above, but also to allow electrical communication among the microelectronic dice 114 disposed within the microelectronic substrate core 102.

Once the interconnection layer 162 is formed, at least one microelectronic device 164 may be attached to a top surface 166 of the interconnection layer 162 by the conductive bumps 160. The conductive bumps 160 active electrical communication between at least one microelectronic device 164 and at least one microelectronic die 114. It is, of course, understood that the conductive bumps 160 may be formed on the interconnection layer 162 (as shown in FIG. 15) or on the microelectronic device 164. It is also understood that, although FIG. 16 illustrates the microelectronic devices 164 as packaged flip-chips, the microelectronic devices may be any known active or passive microelectronic devices 164 including, but not limited to, logic (CPUs), memory (DRAM, SRAM, SDRAM, etc.), controllers (chip sets), capacitors, resistors, and the like. Furthermore, in addition to flip-chip attachment, as illustrated in FIG. 16, attachment of the microelectronic devices 164 may be accomplished by other methods, such as wirebonding or other methods known to those skilled in the art.

Figure 17:
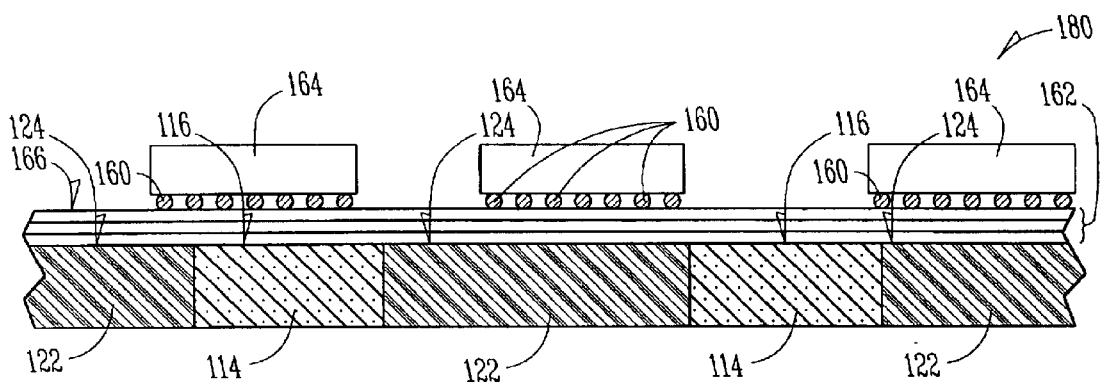
FIG. 17 is a side cross-sectional view of the assembly of FIG. 16 without a microelectronic substrate core, according to the present invention.

FIG. 17 illustrates the assembly of FIG. 16 wherein the microelectronic substrate 180 is fabricated without the microelectronic substrate core 102 (see FIG. 16). The encapsulation material 122 is abutting two adjacent microelectronic dice 114 of the plurality of microelectronic dice 114. The microelectronic substrate 180 is fabricated in a similar manner as described for the microelectronic substrate 170. (see FIG. 16).

Figure 18:
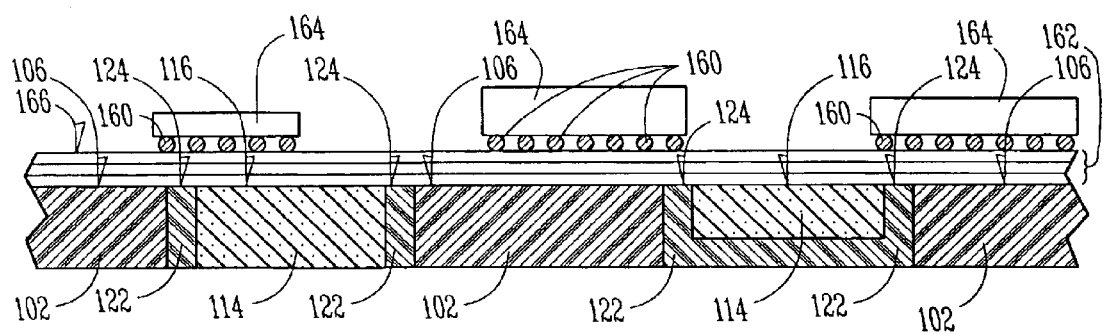
FIG. 18 is a side cross-sectional view of microelectronic dice and devices of varying sizes.
Figure 19:
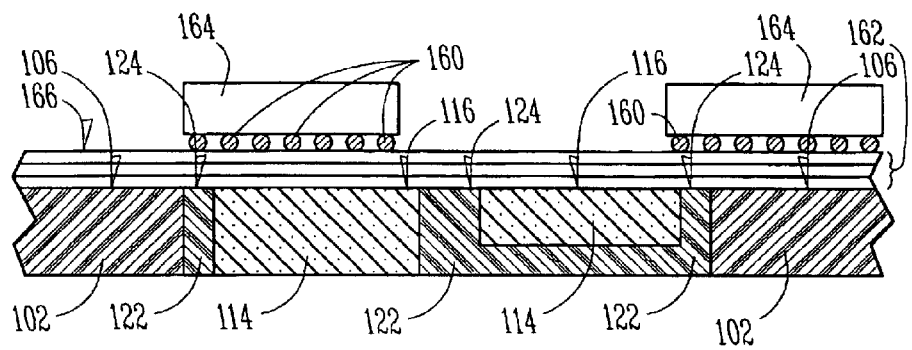
FIG. 19 is a side cross-sectional view of multiple microelectronic dice within a single core opening.
Figure 20:
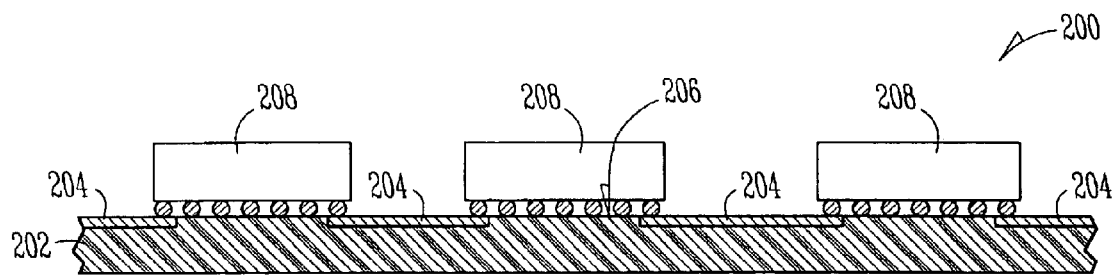
FIG. 20 is a cross-sectional view of a single-sided board, as known in the art.
Figure 21:
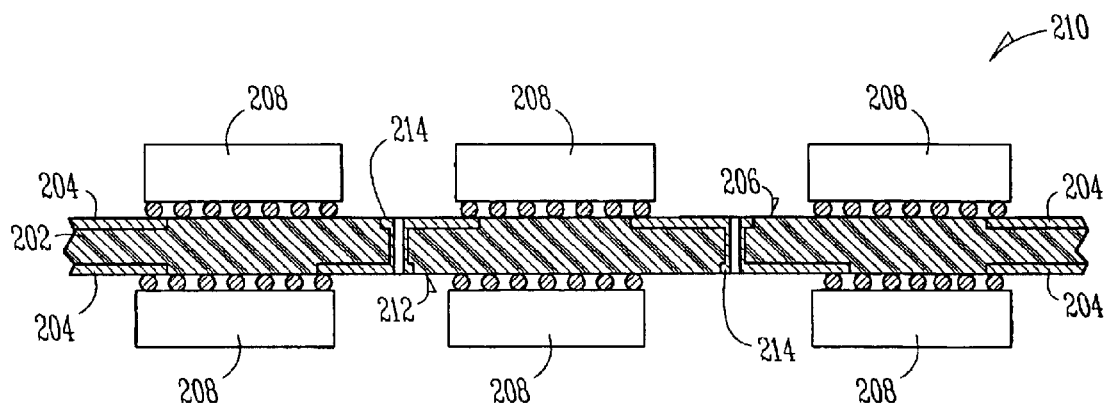
FIG. 21 is a cross-sectional view of a double-sided board, as known in the art.
Figure 22:
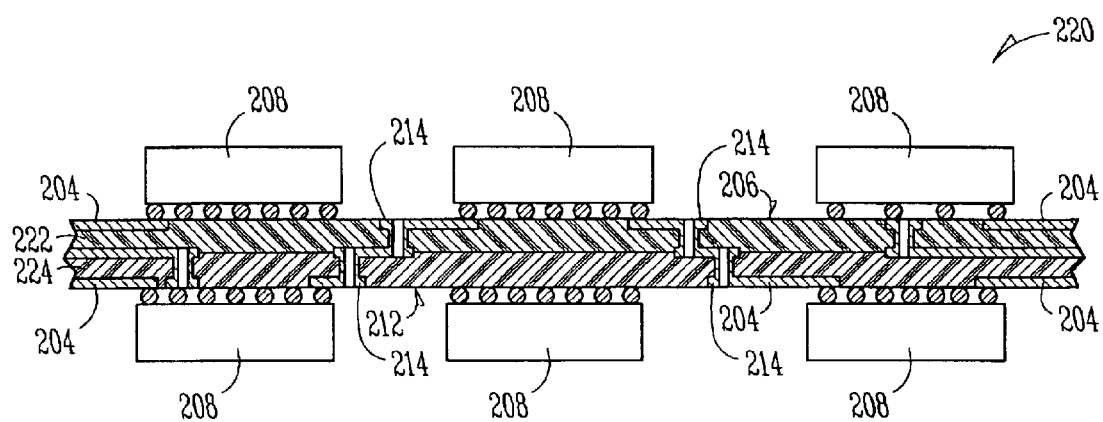
FIG. 22 is a cross-sectional view of a multi-layer board, as known in the art.

As illustrated in FIG. 18, the microelectronic dice 114 and the microelectronic devices 164 may be a variety of sizes and shapes. Furthermore, as illustrated in FIG. 19, a plurality of microelectronic dice 114 may be disposed in a single opening in the microelectronic substrate core 102. This configuration allows interacting microelectronic dice 114 to communicate with one another to be as close as possible to improve electrical performance by shortening conductive trace (not shown) lengths therebetween, as will be understood by those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic substrate, comprising:
   a core having a first surface and an opposing second surface, the core having at least one opening defined therein extending from the core first surface to the core second surface;
   at least one die disposed within the at least one opening, the at least one die having an active surface;
   an encapsulation material adhering the core to the at least one die;
   a first dielectric layer disposed above and on at least one of the core, the die, and the encapsulation material;
   a first plurality of conductive traces disposed above and on the first dielectric layer;
   a second dielectric layer including a second plurality of vias, disposed above and on the first dielectric layer and the first plurality of conductive traces;
   a second plurality of conductive traces disposed above and on the second dielectric layer; and
   a plurality of conductive-bumps disposed above an on the second plurality of conductive traces, wherein at least two of the first dielectric layer, the first plurality of conductive traces, the second dielectric layer, and the second plurality of conductive traces further include interconnection layers, the microelectronic substrate further including:
      at least two microelectronic devices attached at the plurality of conductive bumps, wherein the at least two microelectronic devices include a variety of shapes and sizes.

2. A microelectronic substrate, comprising:
   a core having a first surface and an opposing second surface, the core having at least one opening defined therein extending from the core first surface to the core second surface;
   at least two dice disposed within the at least one opening, each of the at least two dice having an active surface;
   an encapsulation material adhering the core to the at least two dice;
   a first dielectric layer disposed above and on at least one of the core, the at least two dice, and the encapsulation material;
   a first plurality of conductive traces disposed above and on the first dielectric layer;
   a second dielectric layer including a second plurality of vias, disposed above and on the first dielectric layer and the first plurality of conductive traces; and
   a second plurality of conductive traces disposed above and on the second dielectric layer, wherein at least two of the first dielectric layer, the first plurality of conductive traces, the second dielectric layer, and the second plurality of conductive traces further include interconnection layers, the microelectronic substrate further including:
      at least two microelectronic devices attached at the plurality of conductive bumps, wherein the at least two microelectronic devices include a variety of shapes and sizes.

3. The microelectronic substrate of claim 2, wherein each of the second plurality of conductive traces includes a landing pad.

4. The microelectronic substrate of claim 1, wherein each of the second plurality of conductive traces includes a landing pad.

* * * * *